United States Patent
Furukawa

(10) Patent No.: US 6,339,704 B1
(45) Date of Patent: Jan. 15, 2002

(54) SURFACE ACOUSTIC WAVE DEVICE AND COMMUNICATION APPARATUS

(75) Inventor: Osamu Furukawa, Sagamihara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/262,319

(22) Filed: Mar. 4, 1999

(30) Foreign Application Priority Data

Mar. 6, 1998 (JP) .......................................... 10-055562

(51) Int. Cl.[7] ................................................ H04B 1/26
(52) U.S. Cl. .................... 455/313; 455/403; 310/313 R; 333/193; 333/195
(58) Field of Search ................................. 455/403, 453, 455/550, 260, 218, 313, 212; 310/313 B, 313 D, 313 R; 333/186, 195–196, 194, 193

(56) References Cited

U.S. PATENT DOCUMENTS

| | | | | |
|---|---|---|---|---|
| 3,573,673 A | * | 4/1971 | De Vries | 333/72 |
| 4,531,107 A | * | 7/1985 | Okamoto et al. | 333/194 |
| 5,499,003 A | | 3/1996 | Davenport | |
| 5,568,002 A | * | 10/1996 | Kawakatsu et al. | 310/313 B |
| 5,790,000 A | * | 8/1998 | Dai et al. | 333/193 |
| 5,892,418 A | * | 4/1999 | Onishi et al. | 333/193 |
| 5,936,488 A | * | 8/1999 | Taguchi et al. | 333/195 |
| 5,994,980 A | * | 11/1999 | Tada | 333/193 |
| 6,081,172 A | | 6/2000 | Strauss et al. | |
| 6,255,916 B1 | * | 7/2001 | Edmonson | 333/193 |

FOREIGN PATENT DOCUMENTS

| | | |
|---|---|---|
| DE | 198 18 038 | 11/1999 |
| EP | 0 633 659 | 1/1995 |
| EP | 0 698 965 | 2/1996 |
| JP | 7-30367 | * 1/1995 |
| JP | 9-205342 | * 8/1997 |

OTHER PUBLICATIONS

Y. Yasuhara, JEE Journal of Electronic Engineeering, vol. 30, No. 315, pp. 26 to 29, "Makers Refine Saw Filters for Use in Cellular Phones", Mar. 1, 1993.

* cited by examiner

Primary Examiner—William Trost
Assistant Examiner—Conguan Tran
(74) Attorney, Agent, or Firm—Oblon, Spivak, McClelland, Maier & Neustadt, P.C.

(57) ABSTRACT

A surface acoustic wave device with an electrode structure that suppresses the deterioration of a withstand voltage against an overvoltage such as a surge voltage or noise applied to a balanced signal terminal is provided. A serial resonator 5 that blocks a voltage is disposed among IDTs 7, 9, 11 and a signal output terminal 3 of the surface acoustic wave device. In addition, a serial resonator 6 is disposed among the IDTs 7, 9, 11, and a signal output terminal 4. The serial resonators 5 and 6 operate as part of IDTs to extract a desired band signal. The structure of the serial resonator 5 should be almost the same as that of the serial resonator 6.

23 Claims, 10 Drawing Sheets

SURFACE ACOUSTIC WAVE DEVICE AND COMMUNICATION APPARATUS

BACKGROUND OF THE INVENTION

1. Field of the Invention

The present invention relates to a surface acoustic wave device and a communication apparatus.

2. Description of the Related Art

As a conventional surface acoustic wave device, an interdigital transducer structure (hereinafter referred to as IDT structure) as shown in FIG. 14 has been known. In the IDT structure device, electrodes 71 to 77 including signal input terminals 71 and 72 and signal output terminals 73 and 74 formed in a comb line shape are disposed between reflectors 78 and 79. In addition, a structure, where a serial resonator is connected to such an IDT structure surface acoustic wave device, is well known (see Japanese Patent Laid-Open Application No. 7-30367).

Such a surface acoustic wave device has been used as a filter of a mobile communication apparatus. Input terminals and output terminals of such a device are connected in an unbalanced state. However, in recent years, there are needs to use either or both input terminals and output terminals in a balanced state so as to directly connect such a filter to a peripheral circuit (for example, a mixer) disposed downstream thereof.

FIG. 15 is a schematic diagram showing the electrode structure of a surface acoustic wave filter having a serial resonator.

As shown in FIG. 15, the surface acoustic wave filter has balanced output terminals 53 and 54. The balanced output terminals 53 and 54 are directly connected to leads of output IDTs 55, 57, and 59. The balanced output terminals 53 and 54 are also connected to for example a balanced type mixer (not shown) disposed downstream of the balanced output terminals 53 and 54. Input IDTs 56 and 58 are disposed among the output IDTs 55, 57, and 59. The input IDTs 56 and 58 are connected to a low noise amplifier (LNA) disposed upstream thereof through a serial resonator 60. Reflectors 70 are disposed outside the IDTs 55 to 59. In addition, reflectors 70 are disposed outside the serial resonator 60. In FIG. 15, L represents an aperture length. The aperture length L is the width of each transducer. Since the serial resonator 60, located at the input side of the surface acoustic wave filter, widens the band width of a signal, the serial resonator 60 may be omitted depending on the band width of the signal.

When the input side of the filter is unbalanced and the output side of the filter is balanced, although an overvoltage at the unbalanced input terminals 51 and 52 is blocked by the serial resonator 60, an overvoltage at the balanced output terminals 53 and 54 is directly applied to the IDTs 55, 57, and 59.

If a part of the IDTs 55, 57, and 59 short-circuits due to discharging, a surge voltage, or the like, the performance of the filter deteriorates.

When the output side of the filter is balanced, the amplitude of an output signal of the balanced output terminal 53 in the case that the balanced output terminal 54 is terminated should be almost the same as the amplitude of an output signal of the balanced output terminal 54 in the case that the balanced output terminal 53 is terminated. In addition, the phase of the output signal of the balanced output terminal 53 in the case that the balanced output terminal 54 is terminated should be different by around 180° from the phase of the output signal of the balanced output terminal 54 in the case that the balanced output terminal 53 is terminated. These conditions are required to obtain a good balanced output signal.

However, depending on the number of electrodes (or the number of pairs) of the IDT 55 to 59, the aperture length L thereof, and the polarities (directionality) thereof, an output signal of the balanced output terminal 54 may slightly differ from an output signal of the balanced output terminal 53. Thus, it is difficult to adjust such factors for a good balanced output signal.

FIG. 16 shows another electrode structure of a surface acoustic wave device used as a filter. In the structure shown in FIG. 16, output IDTs 62 and 64 are disposed among input IDTs 61, 63, and 65. However, the structure shown in FIG. 16 is the same as that shown in FIG. 15 except that the connecting method of leads of individual electrodes shown in FIG. 16 is different from that shown in FIG. 15. Thus, the same problem takes place against an overvoltage in the inverse direction.

Thus, in the conventional electrode structures, when an overvoltage in the inverse direction of a normal signal or noise is applied, the withstand voltage of the filter deteriorates.

In addition, it is difficult to satisfy conditions for a good balanced output signal and a good balanced input signal.

SUMMARY OF THE INVENTION

The present invention is made from the above-described point of view.

A first object of the present invention is to provide a surface acoustic wave device and a communication apparatus with an electrode structure that suppresses the withstand voltage from deteriorating against an overvoltage applied to a balanced terminal such as a balanced output terminal or a balanced input terminal.

A second object of the present invention is to provide a surface acoustic wave device and a communication apparatus that satisfy better balanced output conditions and better balanced input conditions.

To accomplish such objects, a first aspect of the present invention is a surface acoustic wave device, comprising an unbalanced input terminal to which a signal is added in an unbalanced state, an input transducer unit for exciting a surface acoustic wave with the electrical input added signal from the unbalanced input terminal, an output transducer unit for receiving the surface acoustic wave excited by the input transducer unit and obtaining a desired signal, a first balanced output terminal and a second balanced output terminal for outputting the desired signal obtained by the output transducer unit in a balanced state, a first resonator disposed between the first balanced output terminal and the output transducer unit, and a second resonator disposed between the second balanced output terminal and the output transducer unit.

A second aspect of the present invention is a surface acoustic wave device, comprising a first balanced input terminal and a second balanced input terminal to which a signal is added in a balanced state, an input transducer unit for exciting a surface acoustic wave with the signal added from said first balanced input terminal and said second balanced input terminal, an output transducer unit for receiving the surface acoustic wave excited by said input transducer unit and obtaining a desired signal, an unbalanced output terminal for outputting the desired signal obtained by said output transducer unit in an unbalanced state, a first resonator disposed between said first balanced input terminal and said input transducer unit, and a second resonator disposed between said second balanced input terminal and said input transducer unit.

A third aspect of the present invention is a surface acoustic wave device, comprising a balanced input terminal to which a signal is added in a balanced state, an input transducer unit for exciting a surface acoustic wave with the signal added from said balanced input terminal, An output transducer unit for receiving the surface acoustic wave excited by said input transducer unit and obtaining a desired signal, a first balanced output terminal and a second balanced output terminal for outputting the desired signal obtained by said output transducer unit in a balanced state, a first resonator disposed between said first balanced output terminal and said output transducer unit; and a second resonator disposed between said second balanced output terminal and said output transducer unit.

A fourth aspect of the present invention is a surface acoustic wave device, comprising an unbalanced input terminal to which a signal is added in an unbalanced state, a balanced output terminal from which a signal is put out in a balanced state, a lattice structured resonator group, connected between said unbalanced input terminal and said balanced output terminal, said lattice structured resonator group having a first output point and a second output point connected to said balanced output terminal, said lattice structured resonator group transducing the signal in the unbalanced state added from said unbalanced input terminal into a surface acoustic wave and an electric signal and outputting the surface acoustic wave and the electric signal to the first output point and the second output point, a first resonator disposed between the first output point and said balanced output terminal, and a second resonator disposed between the second output point and said balanced output terminal.

A fifth aspect of the present invention is a surface acoustic wave device, comprising a balanced input terminal to which a signal is added in a balanced state, an unbalanced output terminal from which a signal is put out in an unbalanced state, a lattice structured resonator group, connected between said balanced input terminal and said unbalanced output terminal, said lattice structured resonator group having a first input point and a second input point connected to said balanced input terminal, said lattice structured resonator group transducing the input signal in the balanced state added from said balanced input terminal through the first input point and the second input point into a surface acoustic wave and an electric signal and outputting the surface electric wave and the electric signal to said unbalanced output terminal, a first resonator disposed between the first input point and said balanced input terminal, and a second resonator disposed between the second input point and said balanced input terminal.

A sixth aspect of the present invention is a surface acoustic wave device, comprising a balanced input terminal to which a signal is added in a balanced state, a balanced output terminal from which a signal is put out in a balanced state, a lattice structured resonator group, connected between said balanced input terminal and said balanced output terminal, said lattice structured resonator group having a first output point and a second output point connected to said balanced output terminal, said lattice structured resonator group transducing the input signal in the balanced state added from said balanced input terminal into a surface acoustic wave and an electric signal and outputting the surface electric wave and the electric signal to the first output point and the second output point, a first resonator disposed between the first output point and said balanced output terminal, and a second resonator disposed between the second output point and said balanced output terminal.

A seventh aspect of the present invention is a communication apparatus, comprising first signal outputting means, second signal outputting means, and a surface acoustic wave device disposed between said first signal outputting means and said second signal outputting means, for filtering a signal, wherein said surface acoustic wave device has an unbalanced input terminal to which a signal is added in an unbalanced state, an input transducer unit for exciting a surface acoustic wave with the signal added from said unbalanced input terminal, an output transducer unit for receiving the surface acoustic wave excited by said input transducer unit and obtaining a desired signal, a first balanced output terminal and a second balanced output terminal for outputting the desired signal obtained by said output transducer unit in a balanced state, a first resonator disposed between said first balanced output terminal and said output transducer unit, and a second resonator disposed between said second balanced output terminal and said output transducer unit.

An eighth aspect of the present invention is a communication apparatus, comprising, first signal outputting means, second signal outputting means, and a surface acoustic wave device disposed between said first signal outputting means and said second signal outputting means, for filtering a signal, wherein said surface acoustic wave device hasa first balanced input terminal and a second balanced input terminal to which a signal is added in a balanced state, an input transducer unit for exciting a surface acoustic wave with the signal added from said first balanced input terminal and said second balanced input terminal, an output transducer unit for receiving the surface acoustic wave excited by said input transducer unit and obtaining a desired signal, an unbalanced output terminal for outputting the desired signal obtained by said output transducer unit in an unbalanced state, a first resonator disposed between said first balanced input terminal and said output transducer unit, and a second resonator disposed between said second balanced input terminal and said output transducer unit.

A ninth aspect of the present invention is a communication apparatus, comprising first signal outputting means, second signal outputting means, and a surface acoustic wave device disposed between said first signal outputting means and said second signal outputting means, for filtering a signal, wherein said surface acoustic wave device hasa balanced input terminal to which a signal is added in a balanced state, an input transducer unit for exciting a surface acoustic wave with the signal added from said balanced input terminal, an output transducer unit for receiving the surface acoustic wave excited by said input transducer unit and obtaining a desired signal, a first balanced output terminal and a second balanced output terminal for outputting the desired signal obtained by said output transducer unit in a balanced state, a first resonator disposed between said first balanced output terminal and said output transducer unit, and a second resonator disposed between said second balanced output terminal and said output transducer unit.

A tenth aspect of the present invention is a communication apparatus, comprising first signal outputting means, second signal outputting means, and a surface acoustic wave device disposed between said first signal outputting means and said second signal outputting means, for filtering a signal, wherein said surface acoustic wave device has an unbalanced input terminal to which a signal is added in an unbalanced state, a balanced output terminal from which a signal is put out in a balanced state, a lattice structured resonator group, connected between said unbalanced input terminal and said balanced output terminal, said lattice structured resonator group having a first output point and a second output point connected to said balanced output terminal, said lattice structured resonator group transducing the input signal in the unbalanced state added from said unbalanced input terminal into a surface acoustic wave and an electric signal and outputting the surface electric wave and the electric signal to the first output point and the second output point, a first resonator disposed between the first output point and said balanced output terminal, and a second resonator disposed between the second output point and said balanced output terminal.

An eleventh aspect of the present invention is a communication apparatus, comprising first signal outputting means, second signal outputting means, and a surface acoustic wave device disposed between said first signal outputting means and said second signal outputting means, for filtering a signal, wherein said surface acoustic wave device has a balanced input terminal to which a signal is added in a balanced state, an unbalanced output terminal from which a signal is put out in an unbalanced state, a lattice structured resonator group, connected between said balanced input terminal and said unbalanced output terminal, said lattice structured resonator group having a first input point and a second input point connected to said balanced input terminal, said lattice structured resonator group transducing the input signal in the balanced state added from said balanced input terminal through the first input point and the second input point into a surface acoustic wave and an electric signal and outputting the surface electric wave and the electric signal to said unbalanced output terminal, a first resonator disposed between the first input point and said balanced input terminal, and a second resonator disposed between the second input point and said balanced input terminal.

A twelfth aspect of the present invention is a communication apparatus, comprising first signal outputting means, second signal outputting means, and a surface acoustic wave device disposed between said first signal outputting means and said second signal outputting means, for filtering a signal, wherein said surface acoustic wave device has a balanced input terminal to which a signal is added in a balanced state, a balanced output terminal from which a signal is put out in a balanced state, a lattice structured resonator group, connected between said balanced input terminal and said balanced output terminal, said lattice structured resonator group having a first output point and a second output point connected to said balanced output terminal, said lattice structured resonator group transducing the input signal in the balanced state added from said balanced input terminal into a surface acoustic wave and an electric signal and outputting the surface electric wave and the electric signal to the first output point and the second output point, a first resonator disposed between the first output point and said balanced output terminal, and a second resonator disposed between the second output point and said balanced output terminal.

A thirteenth aspect of the present invention is a communication apparatus, comprising a reception amplifier for amplifying a signal received from an antenna, a band pass filter for extracting a desired band signal from the signal amplified by said reception amplifier, and a mixer for mixing the desired band signal extracted by said band pass filter and a local oscillation signal added from a PLL(Phase Locked loop) oscillator through a local oscillation filter, wherein said band pass filter has a balanced input terminal to which a signal received from said reception amplifier is added in an unbalanced state, an input transducer unit for exciting a surface acoustic wave with the signal added from said unbalanced input terminal, an output transducer unit for receiving the surface acoustic wave excited by said input transducer unit and obtaining a desired signal, a first balanced output terminal and a second balanced output terminal for outputting the desired signal obtained by said output transducer unit in a balanced state to said mixer, a first resonator disposed between said first balanced output terminal and said output transducer unit, and a second resonator disposed between said second balanced output terminal and said output transducer unit.

A fourteenth aspect of the present invention is a communication apparatus, comprising a reception amplifier for amplifying a signal received from an antenna, a band pass filter for extracting a desired band signal from the signal amplified by said reception amplifier; and a mixer for mixing the desired band signal extracted by said band pass filter and a local oscillation signal added from a PLL oscillator through a local oscillation filter, wherein said band pass filter has a balanced input terminal to which a signal received from said reception amplifier is added in a balanced state, an input transducer unit for exciting a surface acoustic wave with the signal added from said balanced input terminal, an output transducer unit for receiving the surface acoustic wave excited by said input transducer unit and obtaining a desired signal, a first balanced output terminal and a second balanced output terminal for outputting the desired signal obtained by said output transducer unit in a balanced state to said mixer, a first resonator disposed between said first balanced output terminal and said output transducer unit, and a second resonator disposed between said second balanced output terminal and said output transducer unit.

A fifteenth aspect of the present invention is a communication apparatus, comprising a reception amplifier for amplifying a signal received from an antenna, a band pass filter for extracting a desired band signal from the signal amplified by said reception amplifier, and a mixer for mixing the desired band signal extracted by said band pass filter and a local oscillation signal added from a PLL oscillator through a local oscillation filter, wherein said band pass filter has an unbalanced input terminal to which a signal received from said reception amplifier is added in an unbalanced state, a balanced output terminal from which a signal is put out in a balanced state, a lattice structured resonator group, connected between said unbalanced input terminal and said balanced output terminal, said lattice structured resonator group having a first output point and a second output point connected to said balanced output terminal, said lattice structured resonator group transducing the input signal in the unbalanced state added from said unbalanced input terminal into a surface acoustic wave and an electric signal and outputting the surface electric wave and the electric signal to the first output point and the second output point, a first resonator disposed between the first output point and said balanced output terminal, and a second resonator disposed between the second output point and said balanced output terminal.

A sixteenth aspect of the present invention is a communication apparatus, comprising a reception amplifier for amplifying a signal received from an antenna, a band pass filter for extracting a desired band signal from the signal amplified by said reception amplifier, and a mixer for mixing the desired band signal extracted by said band pass filter and a local oscillation signal added from a PLL oscillator through a local oscillation filter, wherein said band pass filter has a balanced input terminal to which a signal received from said reception amplifier is added in a balanced state, a balanced output terminal from which a signal is put out in a balanced state, a lattice structured resonator group, connected between said balanced input terminal and said balanced output terminal, said lattice structured resonator group having a first output point and a second output point connected to said balanced output terminal, said lattice structured resonator group transducing the input signal in the balanced state added from said balanced input terminal into a surface acoustic wave and an electric signal and outputting the surface electric wave and the electric signal to the first output point and the second output point, a first resonator disposed between the first output point and said balanced output terminal, and a second resonator disposed between the second output point and said balanced output terminal.

A seventeenth aspect of the present invention is a communication apparatus, comprising an FM modulator for FM-modulating an audio signal added from a microphone, a mixer for mixing the FM-modulated signal put out from said FM modulator and a local oscillation signal added from a PLL oscillator, a band pass filter for filtering a signal put out from said mixer, a transmission amplifier for amplifying a signal filtered by said band pass filter, and an antenna for transmitting a radio frequency wave that is a signal amplified by said transmission amplifier, wherein said band pass filter has a first balanced input terminal and a second balanced input terminal to which the signal mixed by said mixer is added in a balanced state, an input transducer unit for exciting a surface acoustic wave with a signal added from said first balanced input terminal, an output transducer unit for receiving the surface acoustic wave excited by said input transducer unit and obtaining a desired signal, an unbalanced output terminal which puts out the desired signal obtained by said output transducer unit to said transmission amplifier in an unbalanced state, a first resonator disposed between said first balanced input terminal and said input transducer unit, and a second resonator disposed between said second balanced input terminal and said input transducer unit.

An eighteenth aspect of the present invention is a communication apparatus, comprising an FM modulator for FM-modulating an audio signal added from a microphone, a mixer for mixing the FM-modulated signal put out from said FM modulator and a local oscillation signal added from a PLL oscillator, a band pass filter for filtering a signal put out from said mixer, a transmission amplifier for amplifying a signal filtered by said band pass filter, and an antenna for transmitting a radio frequency wave that is a signal amplified by said transmission amplifier, wherein said band pass filter has a balanced input terminal for inputting a signal mixed by said mixer in a balanced state, an input transducer unit for exciting a surface acoustic wave with a signal added from said balanced input terminal, an output transducer unit for receiving the surface acoustic wave excited by said input transducer unit and obtaining a desired signal, a first balanced output terminal and a second balanced output terminal for outputting the desired signal obtained by said output transducer unit to said transmission amplifier in a balanced state, a first resonator disposed between said first balanced output terminal and said output transducer unit, and a second resonator disposed between said second balanced output terminal and said output transducer unit.

A nineteenth aspect of the present invention is a communication apparatus, comprising an FM modulator for FM-modulating an audio signal added from a microphone, a mixer for mixing the FM-modulated signal put out from said FM modulator and a local oscillation signal added from a PLL oscillator, a band pass filter for filtering a signal put out from said mixer, a transmission amplifier for amplifying a signal filtered by said band pass filter, and an antenna for transmitting a radio frequency wave that is a signal amplified by said transmission amplifier, wherein said band pass filter has a balanced input terminal to which a signal mixed by said mixer is added in a balanced state, an unbalanced output terminal from which a signal is put out in an unbalanced state, a lattice structured resonator group, connected between said balanced input terminal and said unbalanced output terminal, said lattice structured resonator group having a first input point and a second input point connected to said balanced input terminal, said lattice structured resonator group transducing the input signal in the balanced state added from the first input point and the second input point into a surface acoustic wave and an electric signal and outputting the surface electric wave and the electric signal to said unbalanced output terminal, a first resonator disposed between the first input point and said balanced input terminal, and a second resonator disposed between the second input point and said balanced input terminal.

A twentieth aspect of the present invention is a communication apparatus, comprising an FM modulator for FM-modulating an audio signal added from a microphone, a mixer for mixing the FM-modulated signal put out from said FM modulator and a local oscillation signal added from a PLL oscillator, a band pass filter for filtering a signal put out from said mixer, a transmission amplifier for amplifying a signal filtered by said band pass filter, and an antenna for transmitting a radio frequency wave that is a signal amplified by said transmission amplifier, wherein said band pass filter has a balanced input terminal to which a signal mixed by said mixer is added in a balanced state, a balanced output terminal from which a signal is put out in a balanced state, a lattice structured resonator group, connected between said balanced input terminal and said balanced output terminal, said lattice structured resonator group having a first output point and a second output point connected to said balanced output terminal, said lattice structured resonator group transducing the input signal in the balanced state added from the first input point and the second input point into a surface acoustic wave and an electric signal and outputting the surface electric wave and the electric signal to the first output point and the second output point, a first resonator disposed between the first output point and said balanced output terminal, and a second resonator disposed between the second output point and said balanced output terminal.

A twenty-first aspect of the present invention is a communication apparatus, comprising a reception amplifier for amplifying a signal received by an antenna, a band pass filter for extracting a desired band signal from the amplified signal amplified by said reception amplifier, a mixer for mixing the desired band signal extracted by said band pass filter and a local oscillation signal added from a PLL oscillator through a local oscillation filter, an IF filter for filtering an intermediate frequency of the signal mixed by said mixer; and an FM demodulator for demodulating a signal filtered by said IF filter, wherein said local oscillation filter has an unbalanced input terminal to which the local oscillation signal oscillated by the PLL oscillator is added in an unbalanced state, an input transducer unit for exciting a surface acoustic wave with the local oscillation signal added from said unbalanced input terminal, an output transducer unit for receiving the surface acoustic wave excited by said input transducer unit and obtaining a desired signal, a first balanced output terminal and a second balanced output terminal from which a desired signal obtained by said output transducer unit is put out to said mixer in a balanced state, a first resonator disposed between said first balanced output terminal and said output transducer unit, and a second resonator disposed between said second balanced output terminal and said output transducer unit.

A twenty-second aspect of the present invention is a communication apparatus, comprising a reception amplifier for amplifying a signal received by an antenna, a band pass filter for extracting a desired band signal from the amplified signal amplified by said reception amplifier, a mixer for mixing the desired band signal extracted by said band pass filter and a local oscillation signal added from a PLL oscillator through a local oscillation filter, an IF filter for filtering an intermediate frequency of the signal mixed by said mixer, and an FM demodulator for demodulating a signal filtered by said IF filter, wherein said local oscillation filter has a balanced input terminal to which the local oscillation signal oscillated by the PLL oscillator is added in a balanced state, an input transducer unit for exciting a surface acoustic wave with the local oscillation signal added from said balanced input terminal, an output transducer unit for receiving the surface acoustic wave excited by said input transducer unit and obtaining a desired signal, a first balanced output terminal and a second balanced output terminal from which the desired signal obtained by said output transducer unit is put out to said mixer in a balanced state, a first resonator disposed between said first balanced output terminal and said output transducer unit, and a second resonator disposed between said second balanced output terminal and said output transducer unit.

A twenty-third aspect of the present invention is a communication apparatus, comprising a reception amplifier for amplifying a signal received by an antenna, a band pass filter for extracting a desired band signal from the amplified signal amplified by said reception amplifier, a mixer for mixing the desired band signal extracted by said band pass filter and a local oscillation signal added from a PLL oscillator through a local oscillation filter, an IF filter for filtering an intermediate frequency of the signal mixed by said mixer, and an FM demodulator for demodulating a signal filtered by said IF filter, wherein said local oscillation filter has an unbalanced input terminal to which the local oscillation signal oscillated by the PLL oscillator is added in an unbalanced state, a balanced output terminal from which a signal is put out in a balanced state, a lattice structured resonator group, connected between said unbalanced input terminal and said balanced output terminal, said lattice structured resonator group having a first output point and a second output point connected to said balanced output terminal, said lattice structured resonator group transducing the input signal in the unbalanced state added from said unbalanced input terminal into a surface acoustic wave and an electric signal, filtering the surface electric wave and the electric signal as the local oscillation signal in a balanced state, and outputting the local oscillation signal to the first output point and the second output point, a first resonator disposed between the first output point and said balanced output terminal, and a second resonator disposed between the second output point and said balanced output terminal.

A twenty-fourth aspect of the present invention is a communication apparatus, comprising a reception amplifier for amplifying a signal received by an antenna, a band pass filter for extracting a desired band signal from the amplified signal amplified by said reception amplifier, a mixer for mixing the desired band signal extracted by said band pass filter and a local oscillation signal added from a PLL oscillator through a local oscillation filter, an IF filter for filtering an intermediate frequency of the signal mixed by said mixer, and an FM demodulator for demodulating a signal filtered by said IF filter, wherein said local oscillation filter has a balanced input terminal to which the local oscillation signal oscillated by the PLL oscillator is added in a balanced state, a balanced output terminal from which a signal is put out in a balanced state, a lattice structured resonator group, connected between said balanced input terminal and said balanced output terminal, said lattice structured resonator group having a first output point and a second output point connected to said balanced output terminal, said lattice structured resonator group transducing the input signal in the balanced state added from said balanced input terminal into a surface acoustic wave and an electric signal, filtering the surface electric wave and the electric signal, and outputting the surface electric wave and the electric signal to the first output point and the second output point, a first resonator disposed between the first output point and said balanced output terminal, and a second resonator disposed between the second output point and said balanced output terminal.

According to the first and third aspect of the present invention, a first resonator is disposed between a first balanced output terminal and an output transducer unit. In addition, a second resonator is disposed between a second balanced output terminal and the output transducer unit. Thus, when an overvoltage or the like is applied to the first and second balanced output terminal in the inverse direction of a normal signal, the overvoltage is blocked by the first and second resonators. Thus, the overvoltage does not almost affect a circuit disposed upstream of the resonators (namely, the output transducer unit).

According to a second aspect of the present invention, a first resonator is disposed between a first balanced input terminal and an input transducer unit. In addition, a second resonator is disposed between a second balanced input terminal and the input transducer unit. Thus, when an overvoltage that is much higher than a normal signal is applied to the first and second balanced input terminals, the overvoltage is blocked by the first and second resonators. Thus, the overvoltage does not almost affect a circuit disposed downstream of the resonators (namely, the input transducer unit).

According to a fourth and sixth aspect of the present invention, a first resonator is disposed between a first output point and a balanced output terminal. In addition, a second resonator is disposed between a second output point and a balanced output terminal. Thus, when an overvoltage is applied to the balanced output terminal in the inverse direction of a normal signal, the overvoltage is blocked by the first and second resonators. Thus, the overvoltage does not almost affect a circuit disposed upstream of the resonators (namely, an output transducer unit).

According to a fifth aspect of the present invention, a first resonator is disposed between a first input point and a balanced input terminal. In addition, a second resonator is disposed between a second input point and the balanced input terminal. Thus, when an overvoltage or the like that is much higher than a normal signal is applied to first and second balanced input terminals, the overvoltage is blocked by the first and second resonators, the overvoltage does not almost affect a circuit disposed downstream of the resonators (namely, a lattice structure resonator group).

According to seventh to twelfth aspects of the present invention, when an overvoltage or the like is applied from a second signal outputting means to a surface acoustic wave device in the inverse direction of a normal signal, the overvoltage is blocked by the surface acoustic wave device. Thus, a first signal outputting means disposed upstream of the surface acoustic wave device can be protected against the overvoltage. In addition, when an overvoltage or the like that is much higher than a normal signal is added from the first signal outputting means to the surface acoustic wave device, the overvoltage is blocked by the surface acoustic wave device. Thus, the second signal outputting means disposed downstream of the surface acoustic wave device can be protected against the overvoltage.

According to thirteenth to sixteenth aspect of the present invention, when an overvoltage or the like is applied from a mixer to a band pass filter in the inverse direction of a normal signal, the overvoltage is blocked by the band pass filter. Thus, a reception amplifier disposed upstream of the band pass filter can be protected against the overvoltage.

According to seventeenth to twentieth aspects of the present invention, when an overvoltage or the like is applied from a transmission amplifier to a band pass filter in the inverse direction of a normal signal, the overvoltage is blocked by the band pass filter. A mixer disposed upstream of the band pass filter can be protected against the overvoltage.

According to twenty-first to twenty-fourth aspects, when an overvoltage is applied from a mixer to a local oscillation filter in the inverse direction of a normal signal, the overvoltage is blocked by the local oscillation filter. Thus, a PLL oscillator disposed upstream of the local oscillation filter can be protected against the overvoltage.

According to twenty-fifth to thirtieth aspects of the present invention, since the structure of a first resonator is almost the same as the structure of a second resonator, a balanced output signal can be obtained.

According to thirty-first to thirty-third aspects of the present invention, when a first resonator and a second resonator are adjusted so that the following factors are satisfied:

$$0.85 \leq (L1 \times n1)/(L2 \times n2) \leq 1.15$$

wherein n1 is the number of comb line electrodes of the first resonator; n2 is the number of comb line electrodes of the second resonator; L1 is the aperture length of the first resonator; and L2 is the aperture length of the second resonator, unbalanced factors can be compensated. Thus, a signal that satisfies better unbalanced output conditions or better balanced input conditions can be obtained.

According to a thirty-fourth aspect, a third resonator is disposed between an unbalanced input terminal and an input transducer unit along with a first resonator and a second resonator. Thus, when an overvoltage that is much higher than a normal signal is added, the overvoltage is blocked by the third resonator. Consequently, the overvoltage does not almost affect a circuit disposed downstream of the third resonator (namely, the input transducer unit). With the effects of the first resonator and the second resonator, both the input and output sides can be protected against the overvoltage.

According to a thirty-fifth aspect of the present invention, a third resonator is disposed between an unbalanced output terminal and an output transducer unit along with a first resonator and a second resonator. Thus, when an overvoltage or the like is applied in the inverse direction of a normal signal, the overvoltage is blocked by the third resonator. Thus, the overvoltage does not almost affect a circuit disposed upstream of the third resonator (namely, the output transducer unit). Consequently, with the effects of the first resonator and the second resonator, both the input and output sides can be protected against the overvoltage.

These and other objects, features and advantages of the present invention will become more apparent in light of the following detailed description of a best mode embodiment thereof, as illustrated in the accompanying drawings.

This application claims priority on Japanese Patent Application No. 10-055562 filed on Mar. 6, 1998, the contents of which are incorporated herein by reference.

DESCRIPTION OF PREFERRED EMBODIMENTS

Next, with reference to the accompanying drawings, an embodiment of the present invention will be described.

Figure 1:
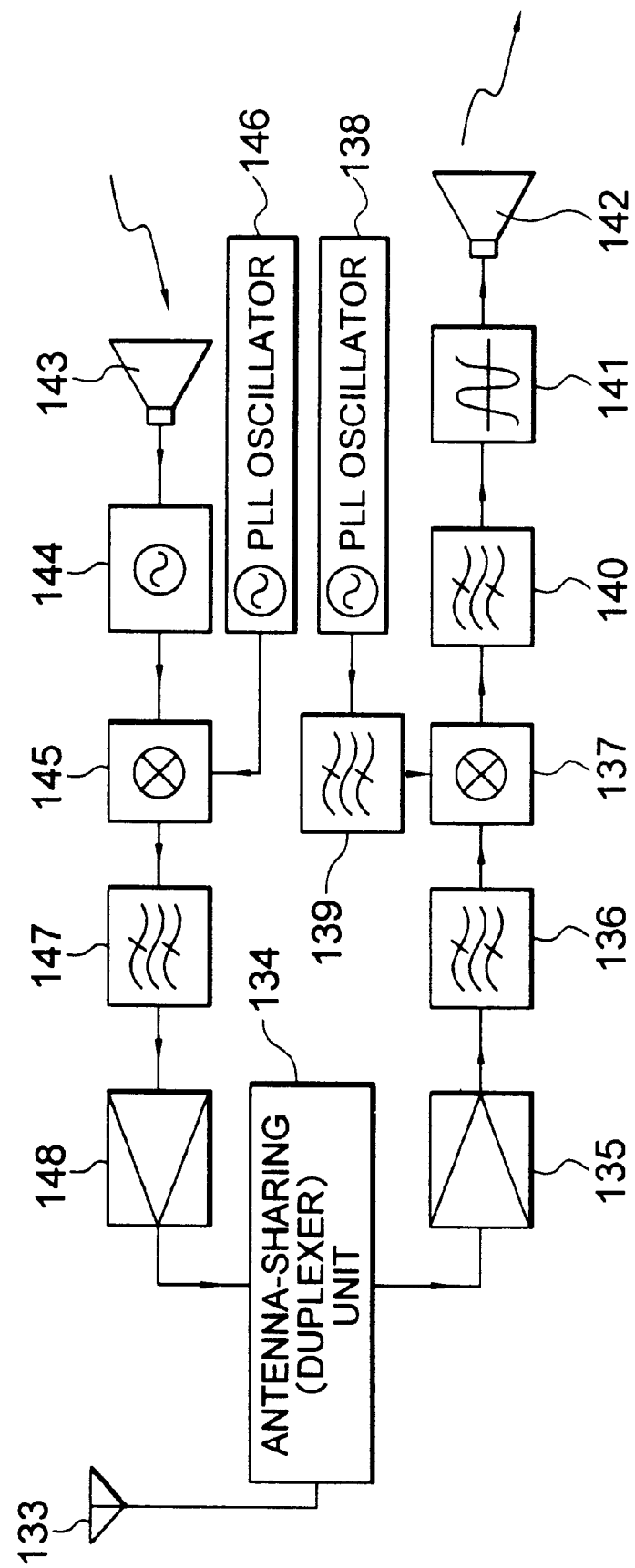
FIG. 1 is a block diagram showing the structure of a mobile communication apparatus according to an embodiment of the present invention.

FIG. 1 is a block diagram showing the structure of a mobile communication apparatus according to an embodiment of the present invention. The mobile communication apparatus is for example a car telephone unit or a cellular telephone unit.

In FIG. 1, reference numeral 133 denotes an antenna. A radio frequency wave is received from the antenna 133. The received radio frequency wave is supplied to an antenna-sharing (duplexer) unit 134. The antenna-sharing (duplexer) unit 134 separates a received signal from the received radio frequency wave. The separated signal is supplied to a low noise amplifier (LNA) 135. The LNA 135 amplifiers the received signal. Thereafter, a reception band pass filter 136 extracts a desired band signal from the received signal. A local oscillation signal oscillated by a PLL oscillator 138 is supplied to a mixer 137 through a local oscillation filter 139. An output signal of the mixer 137 is put out as received sound from a speaker 142 through an IF filter 40 and an FM demodulator 141.

Sound added from a microphone 143 is supplied to a mixer 145 through the FM modulator 144. A local oscillation signal oscillated by a PLL oscillator 146 is added to the mixer 145.

An output signal of the mixer 145 is supplied as a transmission radio frequency wave to the antenna 133 through a transmission band pass filter 147, a power amplifier 148, and the antenna-sharing (duplexer) unit 134.

Each structural portion of the mobile communication apparatus has a surface acoustic wave device. For example, each of the reception band pass filter 136, the local oscillation filter 139, the antenna-sharing (duplexer) unit 134, and the transmission band pass filter 147 has a surface acoustic wave device as an RF filter. In addition, the IF filter 140 has a surface acoustic wave device as a narrow band IF filter necessary for selecting a channel. Moreover, the FM(Frequency Modulation) modulator 144 has a surface acoustic wave device as a surface acoustic wave resonator that FM-modulates sound.

Next, various examples of the surface acoustic wave device used as the reception band pass filter 136 will be described.

Figure 2:
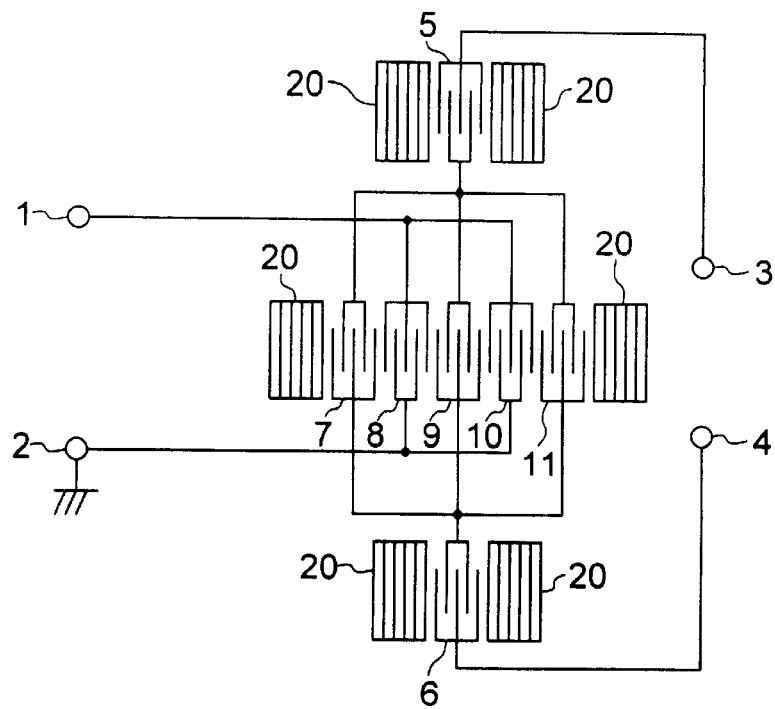
FIG. 2 is a schematic diagram showing a first example of the electrode structure of a surface acoustic wave device according to an embodiment of the present invention.

FIG. 2 is a schematic diagram showing a first example of the electrode structure of the surface acoustic wave device.

In FIG. 2, signal input terminals 1 and 2 are terminals to which a signal is added. Since the signal input terminal 2 is grounded, the pair of the signal input terminal 1 and the signal input terminal 2 is referred to as unbalanced input terminal. A received signal amplified by the LNA 135 is supplied to the unbalanced input terminal. The unbalanced input terminal is connected to input side IDTs 8 and 10 that are comb line transducers.

In the embodiment, three output side IDTs 7, 9, and 11 are disposed. The two input side IDTs 8 and 10 are disposed among the output side IDTs 7, 9, and 11. Five pairs of IDTs of which input side IDTs and output side IDTs are alternately disposed are referred to as 5IDT.

Signal output terminals 3 and 4 are terminals from which a signal is put out. The pair of the signal output terminal 3 and the signal output terminal 4 is referred to as balanced output terminal.

A serial resonator 5 that blocks an inverse voltage is connected between the IDTs 7, 9, and 11 and the signal output terminal 3. A serial resonator 6 that blocks an inverse voltage is connected between the IDTs 7, 9, and 11 and the signal output terminal 4.

The serial resonators 5 and 6 operate as part of the IDTs so as to extract a desired band signal. The structures of the two serial resonators 5 and 6 should be almost the same. In other words, the number of electrodes and the aperture length of the serial resonator 5 should match those of the serial resonator 6. Reflectors 20 are disposed outside the output side IDTs 7 and 11. In addition, reflectors 20 are disposed outside the serial resonators 5 and 6. In other words, the surface acoustic wave device is of balanced output type.

However, it is not necessary to fully match the number of electrode and the aperture length of the serial resonator 5 with those of the serial resonator 6. In other words, signals can be balanced so that the following conditions are satisfied.

$0.85 \leq (L1 \times n1)/(L2 \times n2) \leq 1.15$ (except for the case of $(L1 \times n1)/(L2 \times n2)=1.0$)

where n1 is the number of electrodes of the serial resonator 5; L1 is the aperture length of the serial resonator 5; n2 is the number of electrodes of the serial resonator 6; and L2 is the aperture length of the serial resonator 6.

Preferably, the following conditions should be satisfied.

$0.92 \leq (L1 \times n1)/(L2 \times n2) \leq 1.08$

In the conditions of L1=L2=100 $\mu$m, n1=30, n2=29 or 31, when unbalanced factors are compensated, a signal that satisfies better unbalanced output conditions or better balanced input conditions can be obtained. Thus, a device that satisfies balanced output conditions or balanced input conditions can be provided.

In the mobile communication apparatus, when a radio frequency wave is received by the antenna 133, the received signal is supplied to the antenna-sharing (duplexer) unit 134. The antenna-sharing (duplexer) unit 134 supplies the received signal to the receiving system. The LNA 135 amplifies the received signal and supplies the amplified signal to the reception band pass filter 136. In other words, the amplified signal is supplied to the input terminals 1 and 2 of the surface acoustic wave device.

The received signal is supplied from the input terminals 1 and 2 to the IDTs 8 and 10. The IDTs 8 and 10 excite a surface acoustic wave. The surface acoustic wave is received by the IDTs 7, 9, and 11. A desired band signal is extracted from the signal output terminals 3 and 4 through the IDTs 5 and 6. The extracted band signal is supplied to the mixer 137 on the next stage.

Since the local oscillation signal oscillated by the PLL oscillator 138 is supplied to the mixer 137 through the local oscillation filter 139, the local oscillation signal received through the local oscillation filter 139 and the desired band signal are mixed by the mixer 137. The resultant signal is put out as reception sound from the speaker 142 through the IF filter 140 and the FM modulator 141.

On the other hand, when an inverse voltage such as a surge voltage (overvoltage) or noise is applied from the mixer 137 disposed downstream thereof to the signal output terminals 3 and 4, the inverse voltage is applied and blocked by the serial resonators 5 and 6 connected to the balanced output side. Thus, the inverse voltage does not almost affect a circuit disposed upstream of the serial resonators 5 and 6 (namely, the output side IDTs 7, 9, and 11). Thus, the serial resonators 5 and 6 protect the output side IDTs 7, 9, and 11 against the inverse voltage.

Thus, the electrode structure shown in FIG. 2 tends to suppress the deterioration of a withstand voltage in comparison with the conventional electrode structure of which a mixer is directly connected to output side IDTs.

Next, with reference to FIG. 3, a second example of the electrode structure of the surface acoustic wave device will be described. For simplicity, in FIG. 3, similar portions to those in FIG. 2 will be denoted by similar reference numerals and their description will be omitted.

Figure 3:
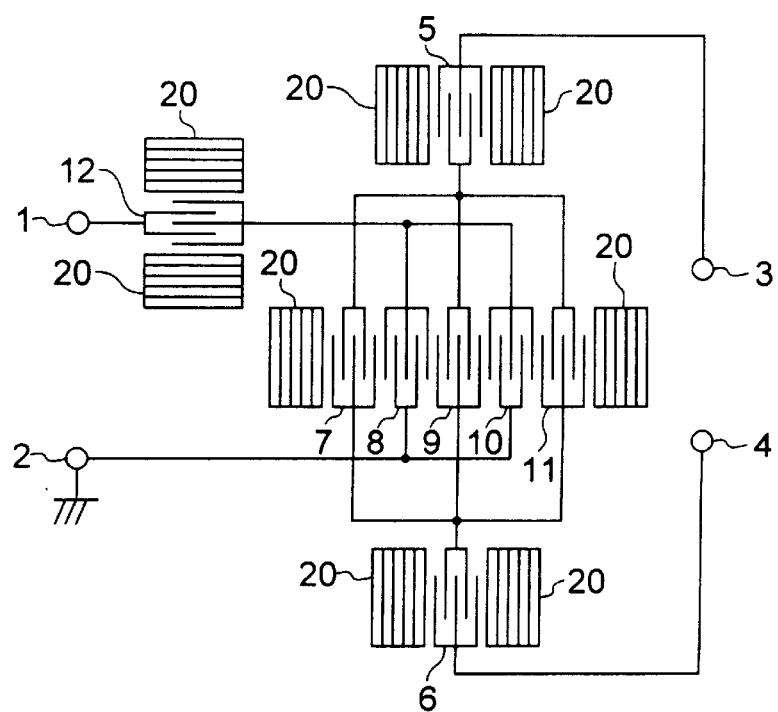
FIG. 3 is a schematic diagram showing a second example of the electrode structure of a surface acoustic wave device according to an embodiment of the present invention.

In FIG. 3, a serial resonator 12 as a third resonator is connected between a signal input terminal 1 and input side IDTs 8 and 10. The serial resonator 12 widens a desired band signal. Reflectors 20 sandwich the serial resonator 12.

In the second example of the electrode structure of the surface acoustic wave device, when an inverse voltage such as a surge voltage (overvoltage) or noise is applied from a mixer 137 disposed downstream of the device to signal output terminals 3 and 4, the inverse voltage is applied to and blocked by serial resonators 5 and 6 connected to both sides of a balanced output terminal. Thus, the inverse voltage does not almost affect a circuit disposed upstream of the serial resonators 5 and 6 (namely, the output side IDTs 7, 9, and 11). Consequently, the serial resonators 5 and 6 protect the output side IDTs 7, 9, and 11 against the inverse voltage.

When a surge voltage is applied from an LNA 135 disposed upstream of the surface acoustic wave device to a signal input terminal 1, the surge voltage is blocked by the serial resonator 12. Thus, the surge voltage does not affect the input side IDTs 8 and 9. Consequently, the serial resonator 12 protects the input side IDTs 8 and 9 against the surge voltage.

Next, with reference to FIG. 4, a third example of the electrode structure of the surface acoustic wave device will be described. For simplicity, in FIG. 4, similar portions to those in FIG. 2 will be denoted by similar reference numerals and their description will be omitted.

Figure 4:
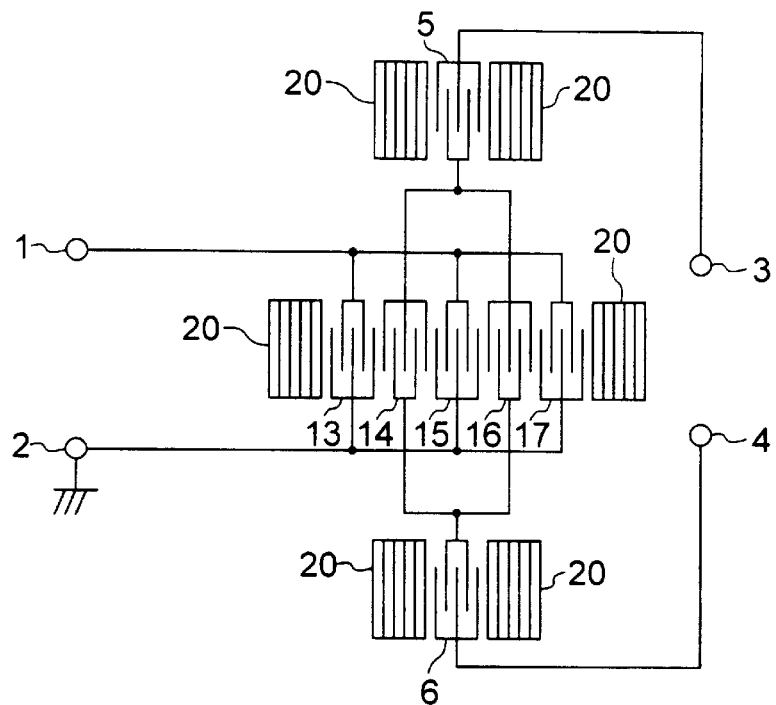
FIG. 4 is a schematic diagram showing a third example of the electrode structure of a surface acoustic wave device according to an of the present invention.

In FIG. 4, input side IDTs 13, 15, and 17 are disposed. Two output side IDTs 14 and 16 are disposed among the input side IDTs 13, 15, and 17. In other words, the third example of the electrode structure of the surface acoustic wave device is 5IDT (that has five resonators (input and output resonators)). The relation of input/output transducers of the third example shown in FIG. 3 is the inverse of the relation of input/output transducers of the first example shown in FIG. 2.

In the third example of the electrode structure of the surface acoustic wave device, when an inverse voltage such as a surge voltage (overvoltage) or noise is applied from a mixer 137 disposed downstream of the device to signal output terminals 3 and 4, the inverse voltage is applied to and blocked by serial resonators 5 and 6 connected to both sides of a balanced output terminal. Thus, the inverse voltage does not almost affect a circuit disposed upstream of the serial resonators 5 and 6 (namely, the output side IDTs 14 and 16). Consequently, the serial resonators 5 and 6 protect the output side IDTs 14 and 16 against the inverse voltage.

Next, with reference to FIG. 5, a fourth example of the electrode structure of the surface acoustic wave device will be described. For simplicity, in FIG. 5, similar portions to those in FIG. 3 will be denoted by similar reference numerals and their description will be omitted.

Figure 5:
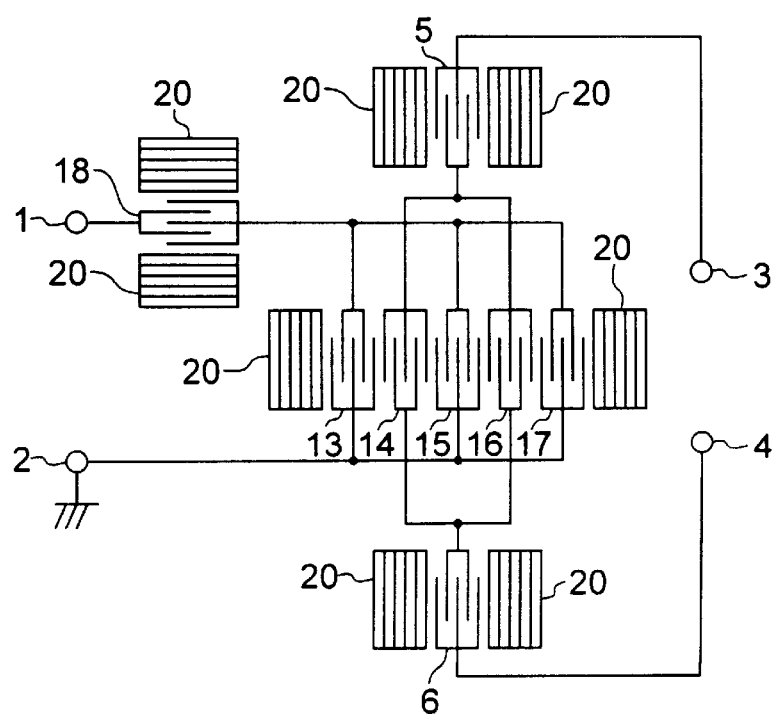
FIG. 5 is a schematic diagram showing a fourth example of the electrode structure of a surface acoustic wave device according to an embodiment of the present invention.

In FIG. 5, a serial resonator 18 is connected between a signal input terminal 1 and input side IDTs 13, 15, and 17. The serial resonator 18 widens a desired band signal.

In the fourth example of the electrode structure of the surface acoustic wave device, when an inverse voltage such as a surge voltage (overvoltage) or noise is applied from a mixer 137 disposed downstream of the device to signal output terminals 3 and 4, the inverse voltage is applied to and blocked by serial resonators 5 and 6 connected to both sides of a balanced output terminal. Thus, the inverse voltage does not almost affect a circuit disposed upstream of the serial resonators 5 and 6 (namely, the output side IDTs 14 and 16). Consequently, the serial resonators 5 and 6 protect the output side IDTs 14 and 16 against the inverse voltage.

When a surge voltage is applied from an LNA 135 disposed upstream of the surface acoustic wave device to a signal input terminal 1, the surge voltage is blocked by the serial resonator 18. Thus, the surge voltage does not affect the input side IDTs 13, 15, and 17. Consequently, the serial resonator 18 protects the input side IDTs 13, 15, and 17 against the surge voltage.

Thus, the electrode structure shown in FIG. 5 tends to suppress the deterioration of a withstand voltage in comparison with the conventional electrode structure of which an LNA 136 is directly connected to a balanced output side IDTs.

Figure 14:
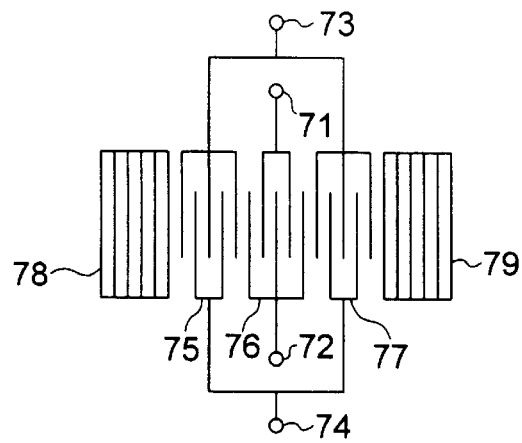
FIG. 14 is a schematic diagram showing the electrode structure of 3IDT as an example of a conventional resonator type transducer.
Figure 15:
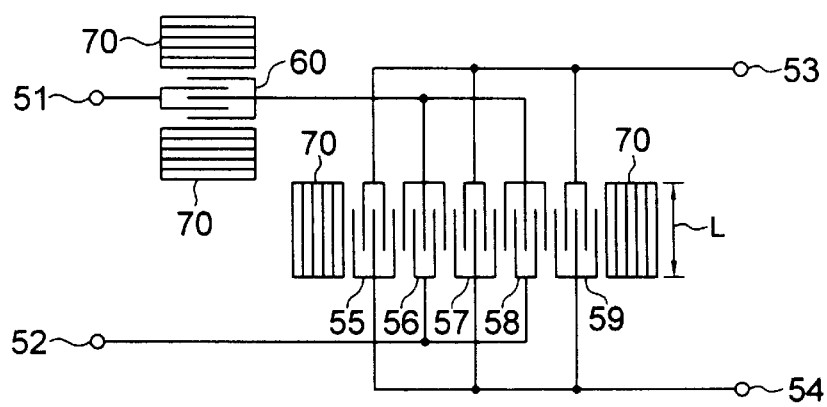
FIG. 15 is a schematic diagram showing an example of the electrode structure of a conventional surface acoustic wave device.
Figure 16:
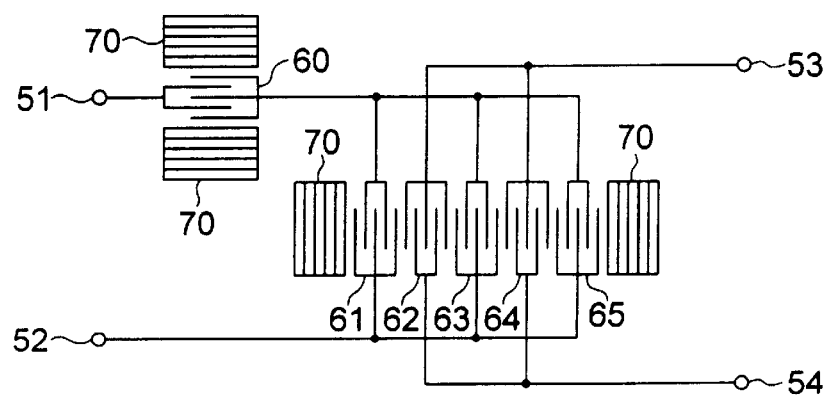
FIG. 16 is a schematic diagram showing another example of the electrode structure of a conventional surface acoustic wave device.

In each of the above-described examples, the 5IDT structure was described. Alternatively, as with the related art reference (see FIG. 14), when serial resonators 5, 6, 12, and 18 are used for 3IDT structure of which an input side IDT 76 is disposed between two output side IDTs 75 and 77, the same effects as the above-described examples can be obtained.

Likewise, in many IDT electrode structures such as 7 IDT structure or 9IDT structure, the same effects as the above-described examples can be obtained.

Next, with reference to FIG. 6, a fifth example of the electrode structure of the surface acoustic wave device will be described. For simplicity, in FIG. 6, similar portions to those in FIG. 2 will be denoted by similar reference numerals and their description will be omitted.

Figure 6:
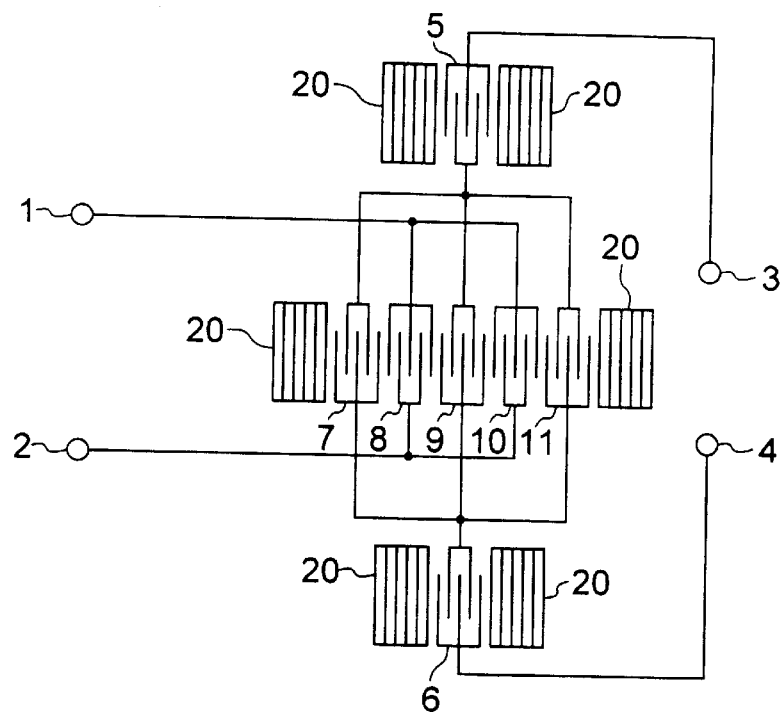
FIG. 6 is a schematic diagram showing a fifth example of the electrode structure of a surface acoustic wave device according to an embodiment of the present invention.

As shown in FIG. 6, in the fifth example, a signal input terminal 2 is not grounded. With a signal input terminal 1 and the signal input terminal 2, a balanced input terminal is formed. As with the first example shown in FIG. 2, in the fifth example, a surge voltage supplied from the balanced output terminal can be blocked.

Next, with reference to FIG. 7, a sixth example of the electrode structure of the surface acoustic wave device will be described. For simplicity, in FIG. 7, similar portions to those in FIG. 2 will be denoted by similar reference numerals and their description will be omitted.

Figure 7:
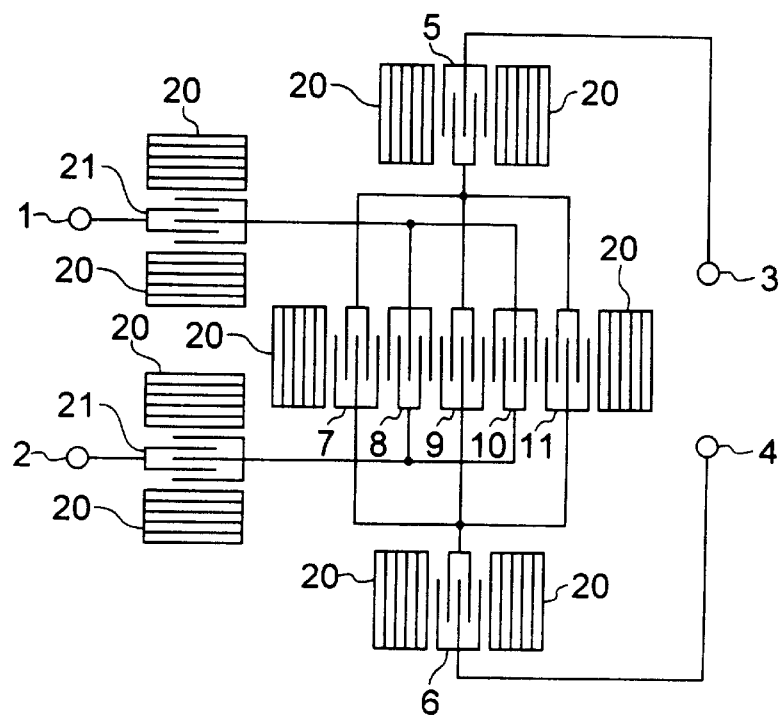
FIG. 7 is a schematic diagram showing a sixth example of the electrode structure of a surface acoustic wave device according to an embodiment of the present invention.

As shown in FIG. 7, in the sixth example, a signal input terminal 2 is not grounded. With a signal input terminal 1 and the signal input terminal 2, a balanced input terminal is formed. A serial resonator 21 is disposed between the signal input terminals 1 and 2. In addition, a serial resonator 21 is disposed between input side IDTs 8 and 9. In the sixth example, the serial resonators 21 block a surge voltage supplied from the balanced output terminal.

Next, with reference to FIG. 8, a seventh example of the electrode structure of the surface acoustic wave device will be described. For simplicity, in FIG. 8, similar portions to those in FIG. 4 will be denoted by similar reference numerals and their description will be omitted.

Figure 8:
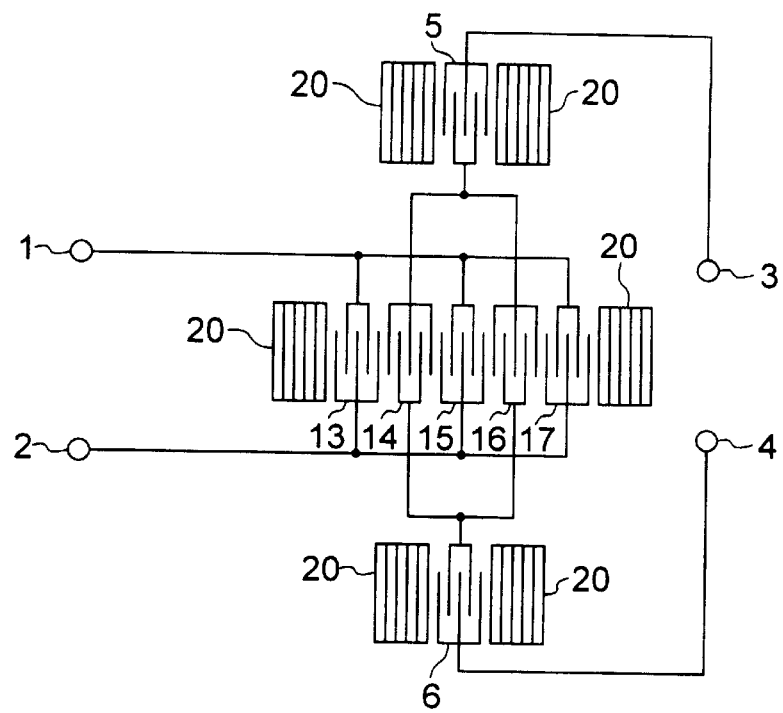
FIG. 8 is a schematic diagram showing a seventh example of the electrode structure of a surface acoustic wave device according to an embodiment of the present invention.

As shown in FIG. 8, in the seventh example, a signal input terminal 2 is not grounded. With a signal input terminal 1 and the signal input terminal 2, a balanced input terminal is formed. As with the third example shown in FIG. 4, in the seventh example, when an inverse voltage such as a surge voltage (overvoltage) or noise is applied from a mixer 137 disposed downstream of the device to signal output terminals 3 and 4, the inverse voltage is blocked by serial resonators 5 and 6. Thus, the inverse voltage does not almost affect a circuit disposed upstream of the serial resonators 5 and 6 (namely, output side IDTs 14 and 16). Consequently, the serial resonators 5 and 6 protect the output side IDTs 14 and 16 against the inverse voltage.

Next, with reference to FIG. 9, an eighth example of the electrode structure of the surface acoustic wave device will be described. For simplicity, in FIG. 9, similar portions to those in FIG. 4 will be denoted by similar reference numerals and their description will be omitted.

Figure 9:
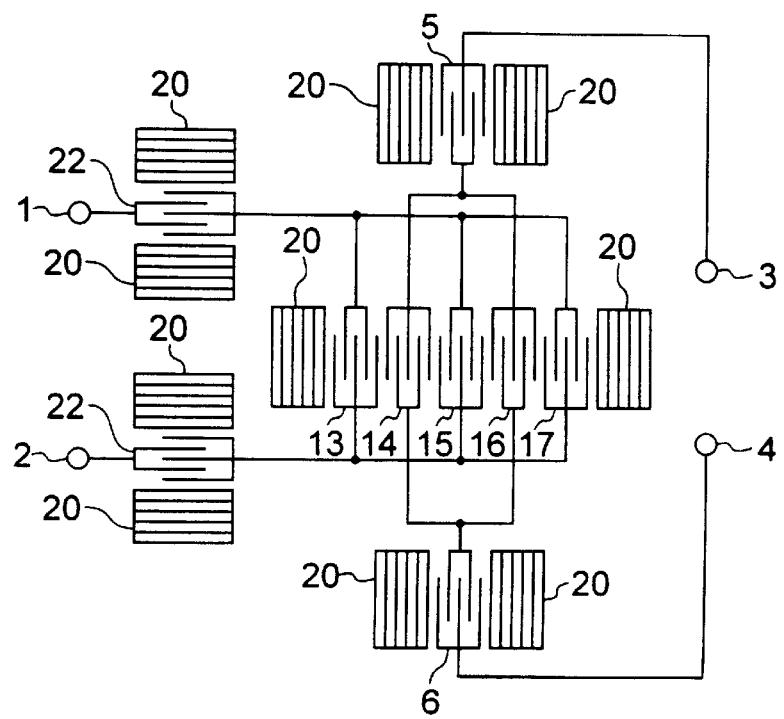
FIG. 9 is a schematic diagram showing an eighth example of the electrode structure of a surface acoustic wave device according to an embodiment of the present invention.

As shown in FIG. 9, in the eighth example, a signal input terminal 2 is not grounded. With a signal input terminal 1 and the signal input terminal 2, a balanced input terminal is formed. A serial resonator 22 is disposed between the signal input terminal 1 and IDTs 13, 15, and 17. In addition, a serial resonator 22 is disposed between the signal input terminal 2 and the IDTs 13, 15, and 17.

In this case, the serial resonators 22 block the surge voltage supplied from the balanced input terminal.

Next, with reference to FIG. 10, a ninth example of the electrode structure of the surface acoustic wave device will be described. For simplicity, in FIG. 10, similar portions to those in FIG. 2 will be denoted by similar reference numerals and their description will be omitted.

Figure 10:
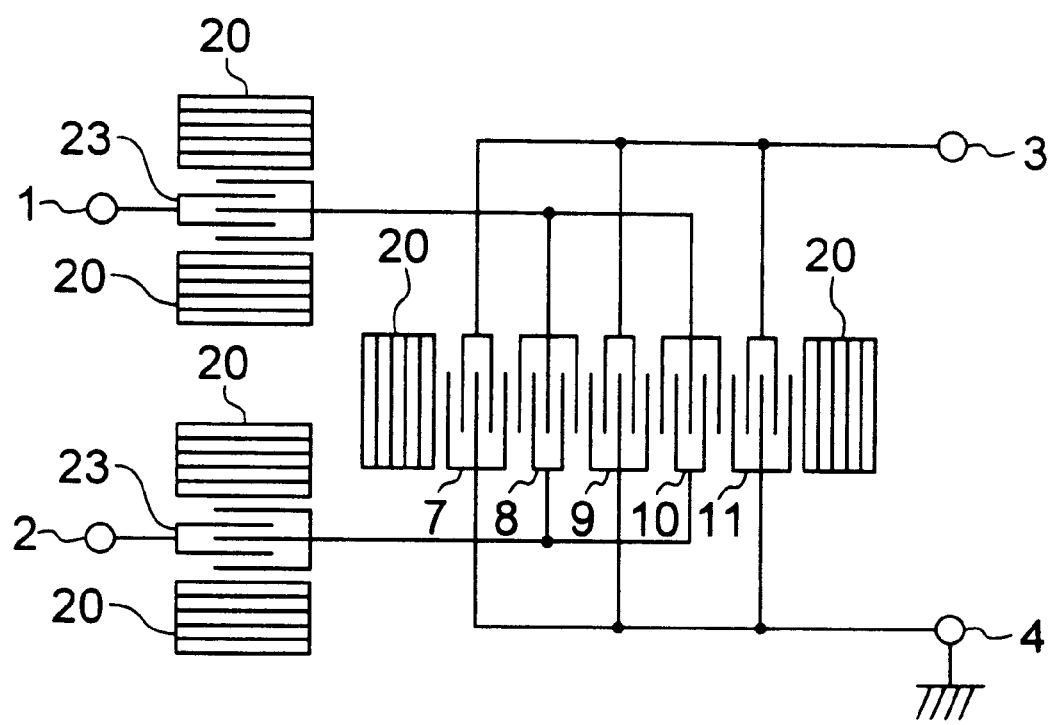
FIG. 10 is a schematic diagram showing a ninth example of the electrode structure of a surface acoustic wave device according to an embodiment of the present invention.

As shown in FIG. 10, in the ninth example, a signal input terminal 2 is not grounded. With a signal input terminal 1 and the signal input terminal 2, a balanced input terminal is formed. In addition, a signal output terminal 4 is grounded. With a signal output terminal 3 and the signal output terminal 4, a signal output side is formed as an unbalanced output terminal.

In the ninth example of the electrode structure of the surface acoustic wave device, when a voltage that is much higher than a normal signal such as a surge voltage (overvoltage) or noise is applied from an amplifier 135 disposed downstream of the device to the signal input terminals 1 and 2, the surge voltage or noise is blocked by serial resonators 23. Thus, the surge or noise does not almost affect a circuit disposed downstream of the serial resonators 23 (namely, input side IDTs 8 and 10). Consequently, the serial resonators 23 protect the input side IDTs 8 and 10 against the surge voltage or noise.

Next, with reference to FIG. 11, a tenth example of the electrode structure of the surface acoustic wave device will be described.

Figure 11:
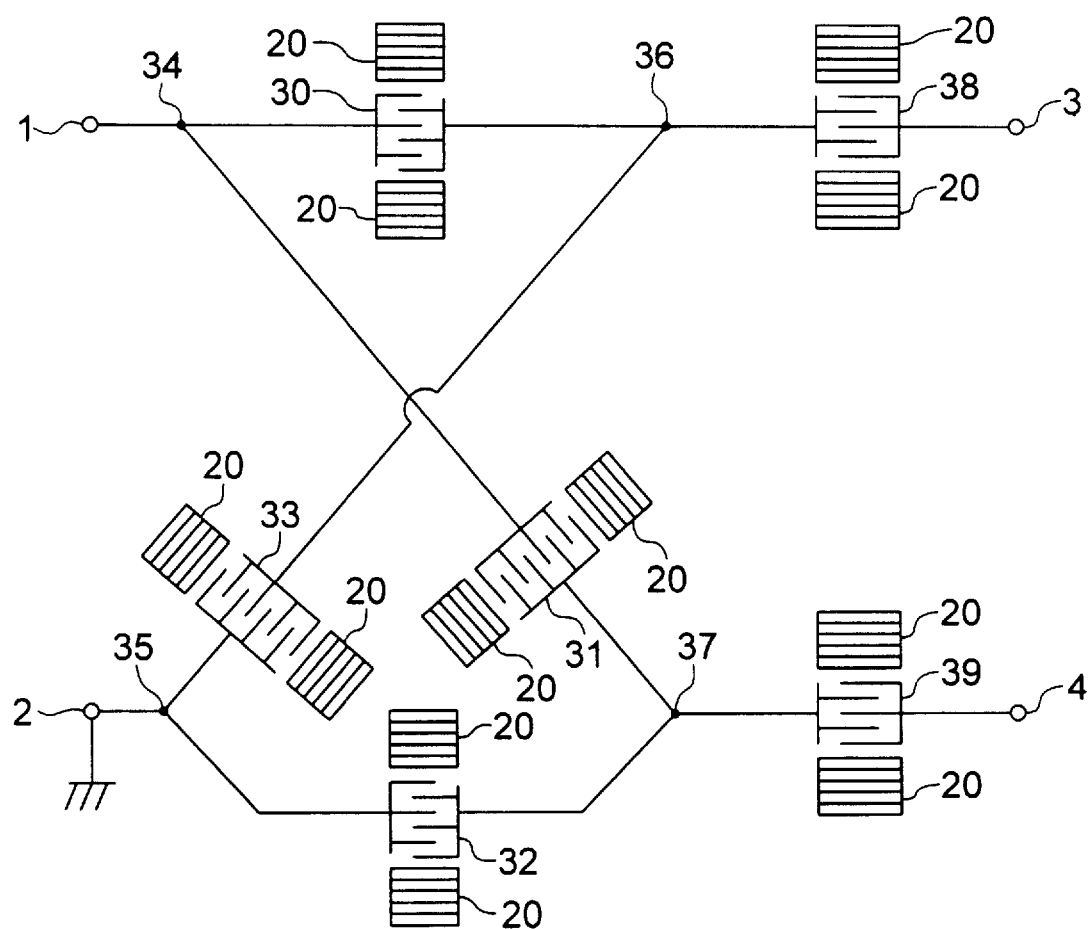
FIG. 11 is a schematic diagram showing a tenth example of the electrode structure of a surface acoustic wave device according to an embodiment of the present invention.

As shown in FIG. 11, signal input terminals 1 and 2 are terminals to which signals are input. The signal input terminal 2 is grounded. With the signal input terminal 1 and the signal input terminal 2, an unbalanced input terminal is formed. A signal is added to the unbalanced input terminal in an unbalanced state. With signal output terminals 3 and 4, a balanced output terminal is formed. A signal is put out from the balanced output terminal in a balanced state. Serial resonators 30 to 33 disposed in a lattice shape are connected to the signal input terminals 1 and 2 and the signal output terminals 3 and 4.

A first input point 34 is disposed between the signal input terminal 1 and the serial resonator 30. The serial resonator 31 is connected to the first input point 34. A second input point 35 is disposed between the signal input terminal 2 and the serial resonator 32. The serial resonator 33 is connected to the second input point 35.

A first output point 36 is disposed between the signal output terminal 3 and the serial resonator 30. The serial resonator is connected to the first output point 36. A second output point 37 is disposed between the signal output terminal 4 and the serial resonator 32. The serial resonator 31 is connected to the second output point 37.

A serial resonator 38 is disposed between the signal output terminal 3 and the first output point 36. A serial resonator 39 is disposed between the signal output terminal 4 and the second output point 37. Each of the serial resonators 30 to 33, 38, and 39 is disposed between reflectors 20. Such an electrode structure is referred to as lattice structure.

In the lattice structure, an input signal in an unbalanced state is received from the signal input terminals 1 and 2 and supplied to the serial resonators 30 to 33 through the first input point 34 and the second input point 35. The serial resonators 30 to 33 convert the input signals into surface acoustic waves and electric signals and output them to the first output point 36 and the second output point 37.

In the tenth example of the electrode structure of the surface acoustic wave device, when an inverse voltage such as a surge voltage (overvoltage) or noise is applied from the signal output terminals 3 and 4, the inverse voltage is blocked by the serial resonators 38 and 39. Thus, the inverse voltage does not almost affect a circuit disposed upstream of the serial resonators 38 and 39 (namely, the serial resonators 30 to 33). Consequently, the serial resonators 38 and 39 protect the serial resonators 30 to 33 that are substantially functional portions.

Especially, in the lattice structure, a fine adjustment is required depending on a balanced state. Thus, the adjustment of the balanced state corresponding to the connection of the serial resonators is important.

Next, with reference to FIG. 12, an eleventh example of the electrode structure of the surface acoustic wave device will be described.

Figure 12:
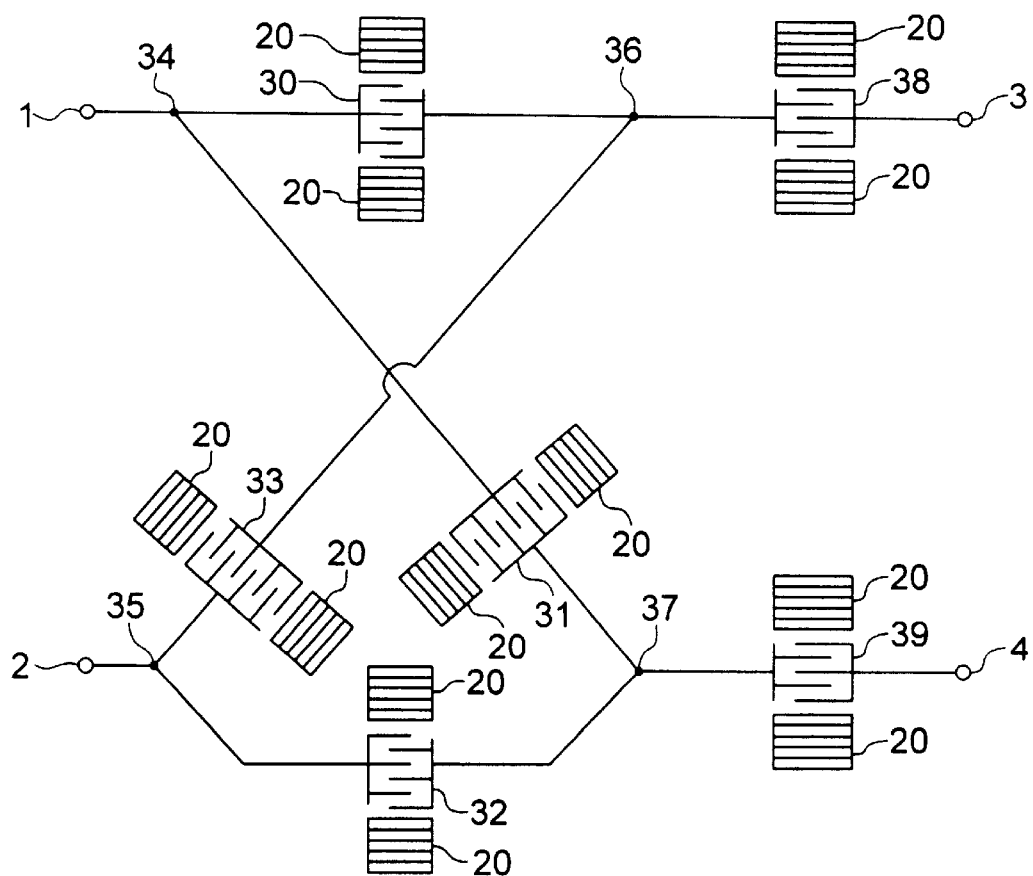
FIG. 12 is a schematic diagram showing an eleventh example of the electrode structure of a surface acoustic wave device according to an embodiment of the present invention.

As shown in FIG. 12, the eleventh example is a modification of the tenth embodiment. A signal input terminal 2 is not grounded. With a signal input terminal 1 and the signal input terminal 2, a balanced input terminal is formed. Both a signal input side and a signal output side are balanced.

As with the tenth example shown in FIG. 11, in the eleventh example, when an inverse voltage such as a surge voltage (overvoltage) or noise is applied to the signal output terminals 3 and 4, the inverse voltage is blocked by the serial resonators 38 and 39. Thus, the inverse voltage does not almost affect a circuit disposed upstream of the serial resonators 38 and 39 (namely, serial resonators 30 to 33). Consequently, the serial resonators 38 and 39 protect the serial resonators 30 to 33 that are substantially functional portions.

Especially, in the lattice structure, a fine adjustment is required depending on a balanced state. Thus, the adjustment of the balanced state corresponding to the connection of the serial resonators is important.

Next, with reference to FIG. 13, a twelfth example of the electrode structure of the surface acoustic wave device will be described.

Figure 13:
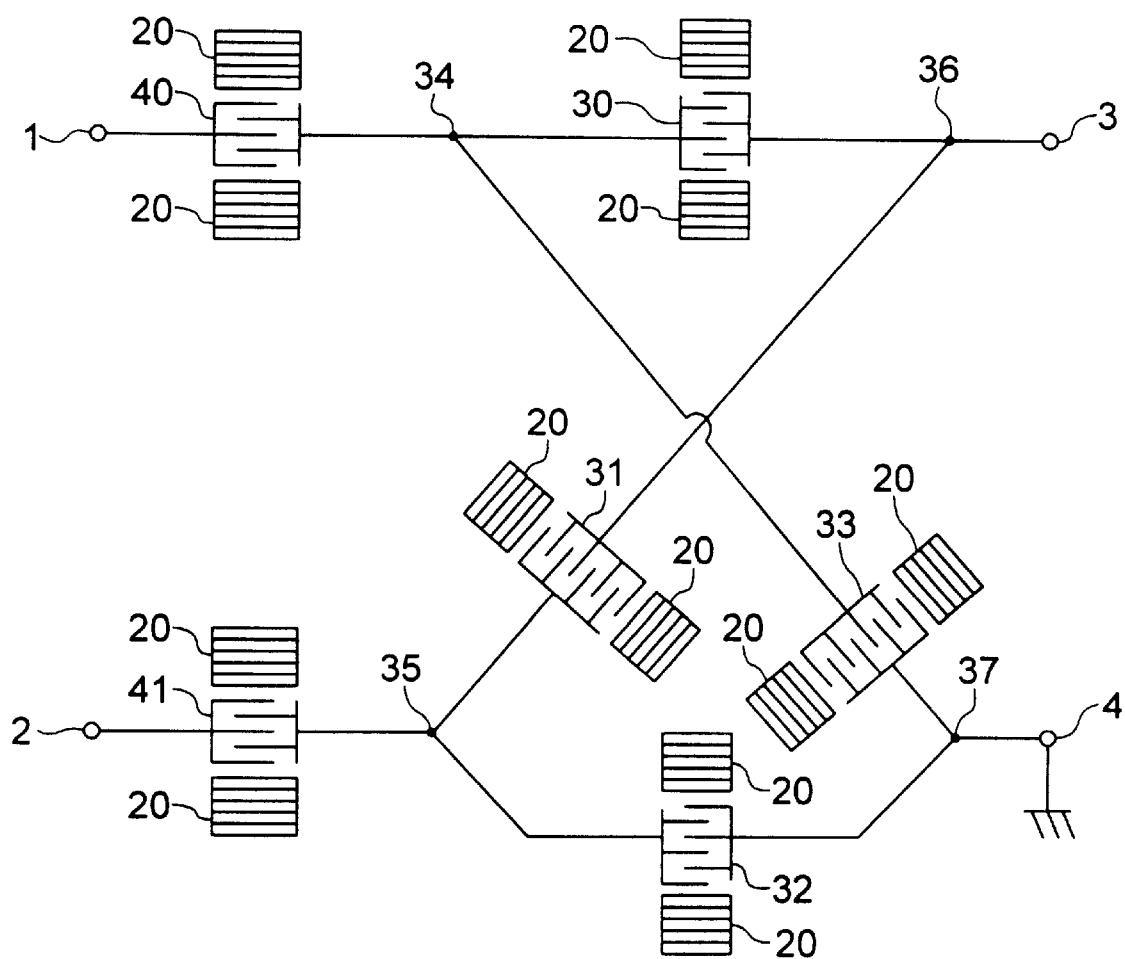
FIG. 13 is a schematic diagram showing a twelfth example the electrode structure of a surface acoustic wave device according to an embodiment of the present invention.

As shown in FIG. 13, the twelfth example is a modification of the tenth example. A signal input terminal 2 is not grounded. With a signal input terminal 1 and the signal input terminal 2, a balanced input terminal is formed. A signal output terminal 4 is grounded. With a signal output terminal 3 and the signal output terminal 4, an unbalanced output terminal is formed. A serial resonator 40 is disposed between the signal input terminal 1 and a first input point 34. In addition, a serial resonator 41 is disposed between the signal input terminal 2 and a second input point 35.

In the eleventh example of the electrode structure of the surface acoustic wave device, when an inverse voltage that is much higher than a normal signal such as a surge voltage (overvoltage) or noise is applied to the signal output terminals 1 and 2, the inverse voltage is blocked by the serial resonators 40 and 41. Thus, the inverse voltage does not almost affect a circuit disposed downstream of the serial resonators 40 and 41 (namely, the serial resonators 30 to 33). Consequently, the serial resonators 40 and 41 protect the serial resonators 30 to 33 that are substantially functional portions.

Especially, in the lattice structure, a fine adjustment is required depending on a balanced state. Thus, the adjustment of the balanced state corresponding to the connection of the serial resonators is important.

In the mobile communication apparatus according to an embodiment of the present invention, when an overvoltage is applied from the balanced output terminals 3 and 4 of the surface acoustic wave device in the inverse direction of a normal signal, the overvoltage is blocked by the serial resonators 5 and 6. Thus, the overvoltage does not almost affect the output side IDTs 7, 9, and 11 shown in FIGS. 2 and 3 and the output side IDTs 14 and 16 shown in FIGS. 4 and 5. Thus, the serial resonators 5 and 6 suppress the deterioration of the performance of the device.

When an overvoltage that is much higher than a normal signal is applied from the signal input terminal 1 as shown in FIGS. 3 and 5, the overvoltage is blocked by the serial resonator 12 shown in FIG. 3 and the serial resonator 18 shown in FIG. 5. Thus, the overvoltage does not almost affect the input side IDTs 8 and 10 shown in FIG. 3 and the input side IDTs 13, 15, and 17 shown in FIG. 5. Thus, the serial resonator 12 and the serial resonator 18 suppress the deterioration of the performance of the filter.

In the above-described examples, the balanced output type surface acoustic wave device (reception band pass filter 136) was described. However, even if the present invention is applied to a balanced input type surface acoustic wave device, when input side IDTs and output side IDTs are substituted each other, the same effects can be obtained.

In other words, the surface acoustic wave device can be used as the transmission band pass filter 147 that filters a signal mixed by the mixer 145.

In this case, since the relation of input/output of the reception band pass filter is substituted with that of the transmission band pass filter 147, a terminal equivalent to the first balanced input terminal becomes a terminal 3. A terminal equivalent to the second balanced input terminal becomes a terminal 4. A signal mixed by the mixer 45 is added to the terminals 3 and 4 in a balanced state. Output terminals of the power amplifier 148 are terminals 1 and 2.

As described, according to the present invention, when an overvoltage or the like is applied to the surface acoustic wave device in the inverse direction of a normal signal, the overvoltage is protected by the surface acoustic wave device. Thus, the surface acoustic wave device can protect a circuit, a device, and a part disposed upstream thereof against the overvoltage.

In addition, a signal that satisfies more excellent balanced output conditions and more excellent balanced input conditions can be extracted.

Moreover, since a resonator is disposed among a balanced output terminal, a balanced input terminal, and a propagation unit of a surface acoustic wave device, even if an overvoltage such as a surge voltage is applied to these terminals, the overvoltage is blocked by a resonator. Thus, the overvoltage does not almost affect the propagation unit.

Thus, a surface acoustic wave device with an electrode structure that suppresses the deterioration of a withstand voltage can be provided.

Although the present invention has been shown and described with respect to a best mode embodiment thereof, it should be understood by those skilled in the art that the foregoing and various other changes, omissions, and additions in the form and detail thereof can be made therein without departing from the spirit and scope of the present invention.

What is claimed is:

1. A surface acoustic wave device, comprising:
   an unbalanced input terminal to which a signal is added in an unbalanced state;
   an input transducer unit for exciting a surface acoustic wave with the signal added from said unbalanced input terminal;
   an output transducer unit for receiving the surface acoustic wave excited by said input transducer unit and obtaining a desired signal;
   a first balanced output terminal and a second balanced output terminal for outputting the desired signal obtained by said output transducer unit in a balanced state;
   a first resonator disposed between said first balanced output terminal and said output transducer unit; and
   a second resonator disposed between said second balanced output terminal and said output transducer unit.

2. The surface acoustic wave device as set forth in claim 1,
   wherein the structure of said first resonator is almost the same as the structure of said second resonator.

3. The surface acoustic wave device as set forth in claim 1,
   wherein said first resonator and said second resonator are inter digital transducers that satisfy the following formula:

$$0.85 \leq (L1 \times n1)/(L2 \times n2) \leq 1.15$$

where n1 is the number of comb line electrodes of said first resonator; n2 is the number of comb line electrodes of said second resonator; L1 is the aperture length of said first resonator; and L2 is the aperture length of said second resonator.

4. The surface acoustic wave device as set forth in claim 1, further comprising:
   a third resonator disposed between said unbalanced input terminal and said input transducer unit.

5. A surface acoustic wave device, comprising:
   a first balanced input terminal and a second balanced input terminal to which a signal is added in a balanced state;
   an input transducer unit for exciting a surface acoustic wave with the signal added from said first balanced input terminal and said second balanced input terminal;
   an output transducer unit for receiving the surface acoustic wave excited by said input transducer unit and obtaining a desired signal;
   an unbalanced output terminal for outputting the desired signal obtained by said output transducer unit in an unbalanced state;
   a first resonator disposed between said first balanced input terminal and said input transducer unit; and
   a second resonator disposed between said second balanced input terminal and said input transducer unit.

6. The surface acoustic wave device as set forth in claim 5,
   wherein the structure of said first resonator is almost the same as the structure of said second resonator.

7. The surface acoustic wave device as set forth in claim 5, wherein said first resonator and said second resonator are inter digital transducers that satisfy the following formula:

$$0.85 \leq (L1 \times n1)/(L2 \times n2) \leq 1.15$$

where n1 is the number of comb line electrodes of said first resonator; n2 is the number of comb line electrodes of said second resonator; L1 is the aperture length of said first resonator; and L2 is the aperture length of said second resonator.

8. The surface acoustic wave device as set forth in claim 5, further comprising:

a third resonator disposed between said unbalanced input terminal and said input transducer unit.

9. A surface acoustic wave device, comprising:

a balanced input terminal to which a signal is added in a balanced state;

an input transducer unit for exciting a surface acoustic wave with the signal added from said balanced input terminal;

an output transducer unit for receiving the surface acoustic wave excited by said input transducer unit and obtaining a desired signal;

a first balanced output terminal and a second balanced output terminal for outputting the desired signal obtained by said output transducer unit in a balanced state;

a first resonator disposed between said first balanced output terminal and said output transducer unit; and a second resonator disposed between said second balanced output terminal and said output transducer unit.

10. The surface acoustic wave device as set forth in claim 9, wherein the structure of said first resonator is almost the same as the structure of said second resonator.

11. The surface acoustic wave device as set forth in claim 9, wherein said first resonator and said second resonator are inter digital transducers that satisfy the following formula:

$$0.85 \leq (L1 \times n1)/(L2 \times n2) \leq 1.15$$

where n1 is the number of comb line electrodes of said first resonator; n2 is the number of comb line electrodes of said second resonator; L1 is the aperture length of said first resonator; and L2 is the aperture length of said second resonator.

12. A surface acoustic wave device, comprising:

an unbalanced input terminal to which a signal is added in an unbalanced state;

a balanced output terminal from which a signal is put out in a balanced state;

a lattice structured resonator group, connected between said unbalanced input terminal and said balanced output terminal, said lattice structured resonator group having a first output point and a second output point connected to said balanced output terminal, said lattice structured resonator group transducing the input signal in the unbalanced state added from said unbalanced input terminal into a surface acoustic wave and an electric signal and outputting the surface electric wave and the electric signal to the first output point and the second output point;

a first resonator disposed between the first output point and said balanced output terminal; and a second resonator disposed between the second output point and said balanced output terminal.

13. The surface acoustic wave device as set forth in claim 12, wherein the structure of said first resonator is almost the same as the structure of said second resonator.

14. A surface acoustic wave device, comprising:

a balanced input terminal to which a signal is added in a balanced state;

an unbalanced output terminal from which a signal is put out in an unbalanced state;

a lattice structured resonator group, connected between said balanced input terminal and said unbalanced output terminal, said lattice structured resonator group having a first input point and a second input point connected to said balanced input terminal, said lattice structured resonator group transducing the input signal in the balanced state added from said balanced input terminal through the first input point and the second input point into a surface acoustic wave and an electric signal and outputting the surface electric wave and the electric signal to said unbalanced output terminal;

a first resonator disposed between the first input point and said balanced input terminal; and a second resonator disposed between the second input point and said balanced input terminal.

15. The surface acoustic wave device as set forth in claim 14, wherein the structure of said first resonator is almost the same as the structure of said second resonator.

16. A surface acoustic wave device, comprising:

a balanced input terminal to which a signal is added in a balanced state;

a balanced output terminal from which a signal is put out in a balanced state;

a lattice structured resonator group, connected between said balanced input terminal and said balanced output terminal, said lattice structured resonator group having a first output point and a second output point connected to said balanced output terminal, said lattice structured resonator group transducing the input signal in the balanced state added from said balanced input terminal into a surface acoustic wave and an electric signal and outputting the surface electric wave and the electric signal to the first output point and the second output point;

a first resonator disposed between the first output point and said balanced output terminal; and a second resonator disposed between the second output point and said balanced output terminal.

17. The surface acoustic wave device as set forth in claim 16, wherein the structure of said first resonator is almost the same as the structure of said second resonator.

18. A communication apparatus, comprising:

first signal outputting means;

second signal outputting means; and a surface acoustic wave device disposed between said first signal outputting means and said second signal outputting means, for filtering a signal, wherein said surface acoustic wave device has:

an unbalanced input terminal to which a signal is added in an unbalanced state;

an input transducer unit for exciting a surface acoustic wave with the signal added from said unbalanced input terminal;

an output transducer unit for receiving the surface acoustic wave excited by said input transducer unit and obtaining a desired signal;

a first balanced output terminal and a second balanced output terminal for outputting the desired signal obtained by said output transducer unit in a balanced state;

a first resonator disposed between said first balanced output terminal and said output transducer unit; and a second resonator disposed between said second balanced output terminal and said output transducer unit.

19. A communication apparatus, comprising:

first signal outputting means;

second signal outputting means; and a surface acoustic wave device disposed between said first signal outputting means and said second signal outputting means, for filtering a signal, wherein said surface acoustic wave device has:

a first balanced input terminal and a second balanced input terminal to which a signal is added in a balanced state;

an input transducer unit for exciting a surface acoustic wave with the signal added from said first balanced input terminal and said second balanced input terminal;

an output transducer unit for receiving the surface acoustic wave excited by said input transducer unit and obtaining a desired signal;

an unbalanced output terminal for outputting the desired signal obtained by said output transducer unit in an unbalanced state;

a first resonator disposed between said first balanced input terminal and said output transducer unit; and a second resonator disposed between said second balanced input terminal and said output transducer unit.

20. A communication apparatus, comprising:

first signal outputting means;

second signal outputting means; and a surface acoustic wave device disposed between said first signal outputting means and said second signal outputting means, for filtering a signal, wherein said surface acoustic wave device has:

a balanced input terminal to which a signal is added in a balanced state;

an input transducer unit for exciting a surface acoustic wave with the signal added from said balanced input terminal;

an output transducer unit for receiving the surface acoustic wave excited by said input transducer unit and obtaining a desired signal;

a first balanced output terminal and a second balanced output terminal for outputting the desired signal obtained by said output transducer unit in a balanced state;

a first resonator disposed between said first balanced output terminal and said output transducer unit; and a second resonator disposed between said second balanced output terminal and said output transducer unit.

21. A communication apparatus, comprising:

first signal outputting means;

second signal outputting means; and a surface acoustic wave device disposed between said first signal outputting means and said second signal outputting means, for filtering a signal, wherein said surface acoustic wave device has:

an unbalanced input terminal to which a signal is added in an unbalanced state;

a balanced output terminal from which a signal is put out in a balanced state;

a lattice structured resonator group, connected between said unbalanced input terminal and said balanced output terminal, said lattice structured resonator group having a first output point and a second output point connected to said balanced output terminal, said lattice structured resonator group transducing the input signal in the unbalanced state added from said unbalanced input terminal into a surface acoustic wave and an electric signal and outputting the surface electric wave and the electric signal to the first output point and the second output point;

a first resonator disposed between the first output point and said balanced output terminal; and a second resonator disposed between the second output point and said balanced output terminal.

22. A communication apparatus, comprising:

first signal outputting means;

second signal outputting means; and a surface acoustic wave device disposed between said first signal outputting means and said second signal outputting means, for filtering a signal, wherein said surface acoustic wave device has:

a balanced input terminal to which a signal is added in a balanced state;

an unbalanced output terminal from which a signal is put out in an unbalanced state;

a lattice structured resonator group, connected between said balanced input terminal and said unbalanced output terminal, said lattice structured resonator group having a first input point and a second input point connected to said balanced input terminal, said lattice structured resonator group transducing the input signal in the balanced state added from said balanced input terminal through the first input point and the second input point into a surface acoustic wave and an electric signal and outputting the surface electric wave and the electric signal to said unbalanced output terminal;

a first resonator disposed between the first input point and said balanced input terminal; and a second resonator disposed between the second input point and said balanced input terminal.

23. A communication apparatus, comprising:

first signal outputting means;

second signal outputting means; and a surface acoustic wave device disposed between said first signal outputting means and said second signal outputting means, for filtering a signal, wherein said surface acoustic wave device has:

a balanced input terminal to which a signal is added in a balanced state;

a balanced output terminal from which a signal is put out in a balanced state;

a lattice structured resonator group, connected between said balanced input terminal and said balanced output terminal, said lattice structured resonator group having a first output point and a second output point connected to said balanced output terminal, said lattice structured resonator group transducing the input signal in the balanced state added from said balanced input terminal into a surface acoustic wave and an electric signal and outputting the surface electric wave and the electric signal to the first output point and the second output point;

a first resonator disposed between the first output point and said balanced output terminal; and a second resonator disposed between the second output point and said balanced output terminal.

* * * * *